United States Patent
Gabriels et al.

(12) 
(10) Patent No.: US 6,569,278 B1
(45) Date of Patent: May 27, 2003

(54) POWDER METAL POLYMER ORGANIC SHEET PUNCHING FOR SUBSTRATE CONDUCTORS

(75) Inventors: David H. Gabriels, Cold Spring, NY (US); James Humenik, LaGrangeville, NY (US); John U. Knickerbocker, Hopewell Junction, NY (US); David C. Long, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/408,355

(22) Filed: Sep. 29, 1999

(51) Int. Cl.⁷ ................................ B32B 31/00
(52) U.S. Cl. .................. 156/261; 156/263; 156/264; 156/265; 156/293; 156/298; 156/269; 156/512; 156/513; 156/518; 156/521; 156/530
(58) Field of Search ................. 156/264, 265, 156/298, 512, 293, 262, 520, 530, 261, 263, 513, 518, 521, 269; 29/306.1, 313; 83/39

(56) References Cited

U.S. PATENT DOCUMENTS

| | | | | |
|---|---|---|---|---|
| 1,921,808 A | * | 8/1933 | Cohn | 156/82 |
| 4,234,367 A | | 11/1980 | Herron et al. | 156/89.18 |
| 4,302,625 A | | 11/1981 | Hetherington et al. | 174/264 |
| 4,539,058 A | * | 9/1985 | Burgess et al. | 156/250 |
| 4,799,984 A | | 1/1989 | Rellick | 156/89.12 |
| 5,695,591 A | * | 12/1997 | Hamada et al. | 156/272.8 |
| 6,072,690 A | * | 6/2000 | Farooq et al. | 361/321.2 |

* cited by examiner

*Primary Examiner*—Linda Gray
(74) *Attorney, Agent, or Firm*—McGinn & Gibb, P.C.; Ira D. Blecker

(57) ABSTRACT

A method and structure for filling an opening in a substrate which includes positioning a sheet above the substrate and punching the sheet into the opening in the substrate, wherein the sheet and the substrate have similar shrinkage characteristics when subjected to a subsequent sintering process.

20 Claims, 3 Drawing Sheets

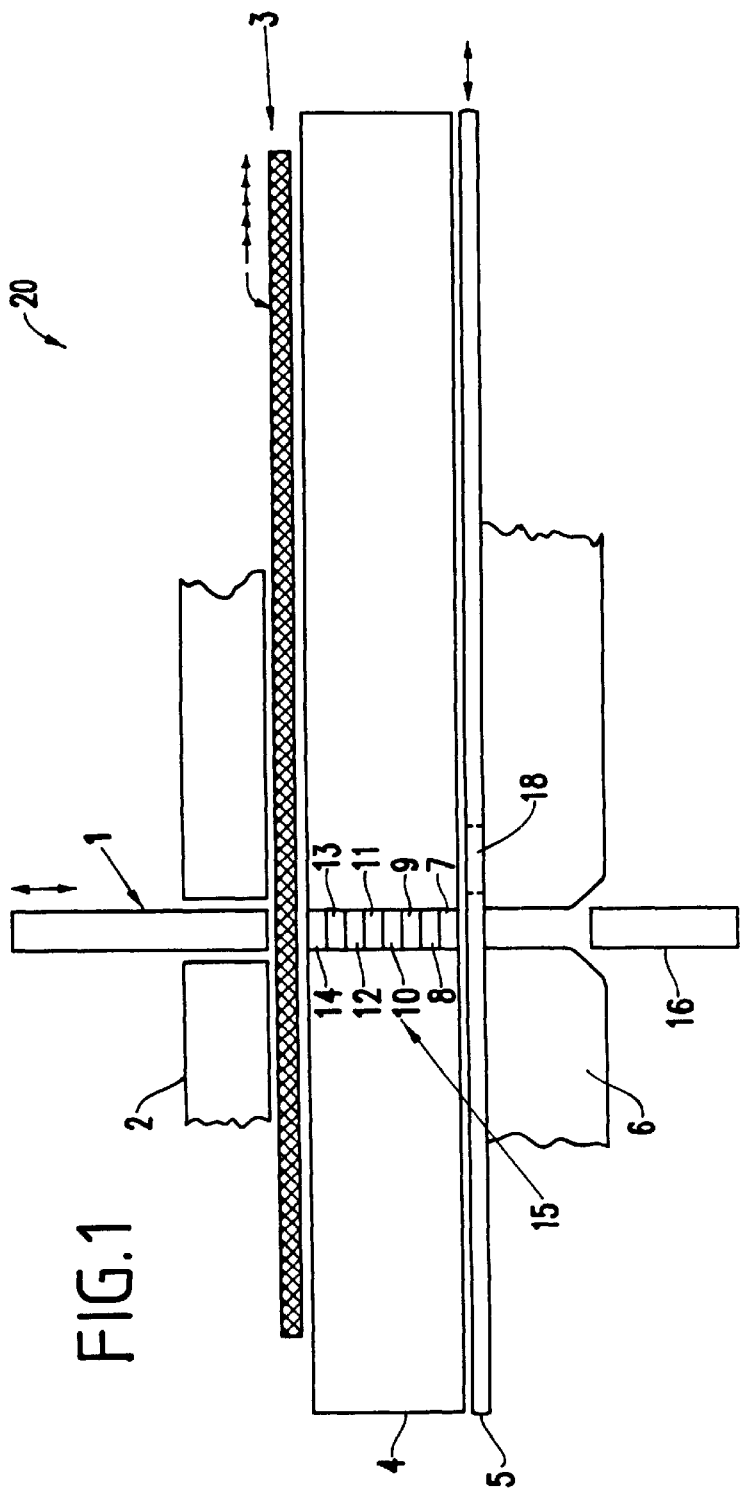

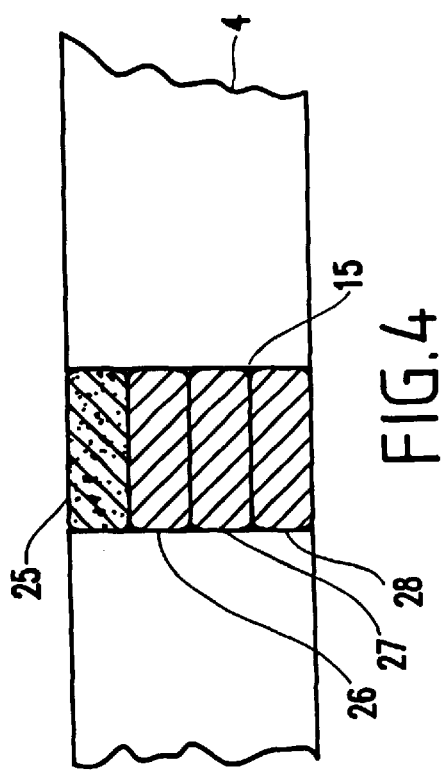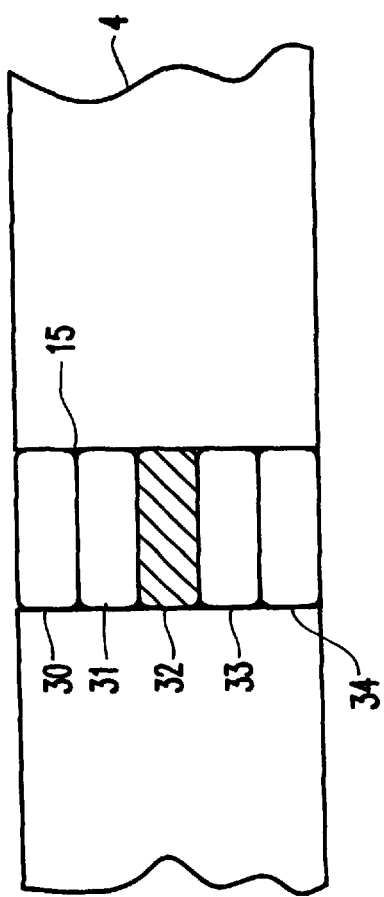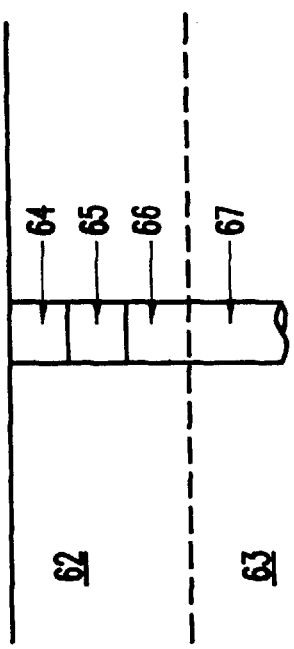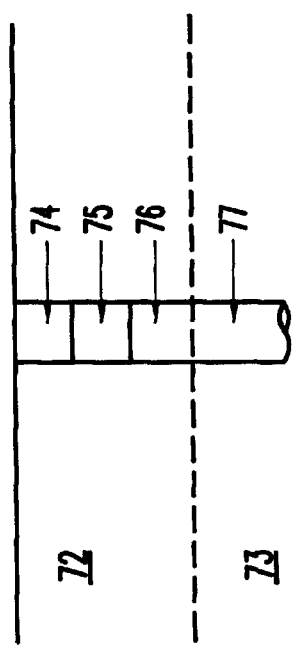

POWDER METAL POLYMER ORGANIC SHEET PUNCHING FOR SUBSTRATE CONDUCTORS

BACKGROUND OF THE INVENTION

1. Field of the Invention

The present invention generally relates to multilayer ceramic substrates and a method for forming the same, and more particularly, relates to the metalizing of via holes using a dry method rather than the conventional metallic paste methods.

2. Description of the Related Art

Ceramic packages for supporting semiconductor devices and the like conventionally include a ceramic substrate with printed conductive circuits connected to the semiconductor device, to input/output pins or to other connections joined to boards or the like. While many techniques are known for forming such ceramic substrates, one of the most popular procedures for such fabrication involves the casting of what is termed a ceramic greensheet. The fabrication process involves personalizing ceramic greensheets, stacking, laminating, and then fusing them together (sintering) under elevated temperatures to form a substrate. This method of producing such multilayer ceramic (hereafter MLC) substrates for semiconductor packaging and other electronics applications is well known as illustrated in Herron et al. U.S. Pat. No. 4,234,367, Hetherington et al. U.S. Pat. No. 4,302,625, and Rellick U.S. Pat. No. 4,799,984, the disclosures of which are incorporated by reference herein.

In this multilayer ceramic (MLC) substrate technology, ceramic greensheets of ceramic powder (held together in sheet form by a suitable aqueous-based or organic-based binder) are punched to form via holes in a predefined pattern using a via punch tool.

The via holes are subsequently filled with a conductive paste and metallurgy lines are formed on the surface of the greensheet by screening or extrusion printing. The conductive paste is made of a suitable metallic material which will densify in a manner similar to the ceramic during the subsequent sintering process. The metallized sheets are stacked, laminated and fired in an appropriate atmosphere to form a monolithic MLC substrate with a complex internal circuitry.

The process of extrusion or screen printing to fill punched via holes with conductive paste can have several drawbacks. For example, in screen printing, a separate two mask/two pass operation is required. The first mask/pass fills the vias, and the second mask/pass prints an x-y circuit pattern. This two mask/two pass process is expensive. Alternatively, if extrusion printing is used, the vias can be filled and the x-y pattern printed simultaneously (e.g., in a single step). However, with the extrusion printing process, the same paste must be used to fill the via and create the x-y surface pattern. This is not always desirable. The above wet processes can also distort the punched ceramic greensheet as the solvents and oils in the metallic paste are absorbed into the greensheet. After screening, the sheets are dried in an oven. Additionally, these wet processes can require large amounts of chemicals to clean paste residue from the masks.

In the above processing, defects can arise due to screened paste bridging between adjacent lines or due to the absence of conductive paste in an intended contiguous line. With advancements in semiconductor technology driving toward increased total connections and decreased spacing between features, the fabrication of screen printed or extrusion printed conductors for subsequent cofiring can lead to reduced yields or the inability to effectively fabricate microelectronic components cost effectively. Additionally, as feature sizes become smaller, the desire for increased current carrying cross section becomes increasingly important to meet the needs of increasing power and higher frequency. However, such structures must also be fabricated with controlled impedance (matched to a chip of 50 to 55 ohms is typical). Also, it is critical to control noise by improving feature size uniformity and reduce inductance by using thinner dielectrics. For lamination and cofiring, the existing process can provide challenges such as having a non-uniform density of material across a green laminate. This can cause non-uniformity in sintering which can lead to non-flat packages or other defects.

Therefore, there is a need for a new process of placing metal features in such ceramic greensheets which avoids the expense of the conventional systems discussed above and which increases yield.

SUMMARY OF THE INVENTION

It is, therefore, an object of the present invention to provide a structure and method for filling an opening in a ceramic greensheet which includes positioning a sheet of conductive metal above the ceramic greensheet and punching the metal sheet into the opening in the ceramic greensheet. The components of the metal sheet and the ceramic greensheet have similar shrinkage characteristics when subjected to a subsequent sintering process.

The ceramic greensheet could be a ceramic insulator and the metal sheet could be a powder metal in an organic/polymer matrix. The metal sheet preferably has a thickness less than that of the ceramic greensheet. In one embodiment, the metal sheet is repeatedly punched into the ceramic greensheet until the opening is full. The distinct layers of the metal sheet elements punched into the ceramic greensheet can all be of one material composition or can be of varying mixtures of metal, ceramics, and organics. The distinct layers can form a capacitor or can comprise a series of graduated material features (e.g., stepped gradient via, inverted via, etc.) within the opening.

The metal sheet can be formed by a process that includes mixing metal containing powders with an organic binder and solvent to form a slurry and casting the slurry into sheets or other techniques where metal particles can be incorporated into an organic matrix.

Another embodiment of the invention is a process for forming a multi-layer capacitive structure in a substrate which includes punching a first material into an opening in the substrate and punching a second material different than the first material into the opening above the first material, such that the first material and the second material remain in the opening. This process could include punching additional material layers having different compositions or combinations of metal conductors plus fillers into the opening.

Yet another embodiment of the invention is a process for forming a multilayer ceramic substrate which includes positioning a sheet above a ceramic substrate and punching the sheet into an opening in the ceramic substrate, wherein the sheet and the ceramic substrate have similar shrinkage characteristics when subjected to a subsequent sintering process.

BRIEF DESCRIPTION OF THE DRAWINGS

The foregoing and other objects, aspects and advantages will be better understood from the following detailed description of a preferred embodiment of the invention with reference to the drawings, in which:

FIG. 1 is a schematic diagram of a greensheet and punch tool assembly;

FIGS. 2A–2C illustrate possible movements of a metal polymer organic sheet;

FIG. 4 is a schematic diagram of an expanded view of the via hole in FIGS. 1 and 3;

FIG. 5 is a schematic diagram of an expanded view of the via hole in FIGS. 1 and 3;

FIG. 6 is a schematic diagram of a stepped gradient via; and

FIG. 7 is a schematic diagram of an inverted gradient via.

DETAILED DESCRIPTION OF PREFERRED EMBODIMENTS OF THE INVENTION

Figure 3:
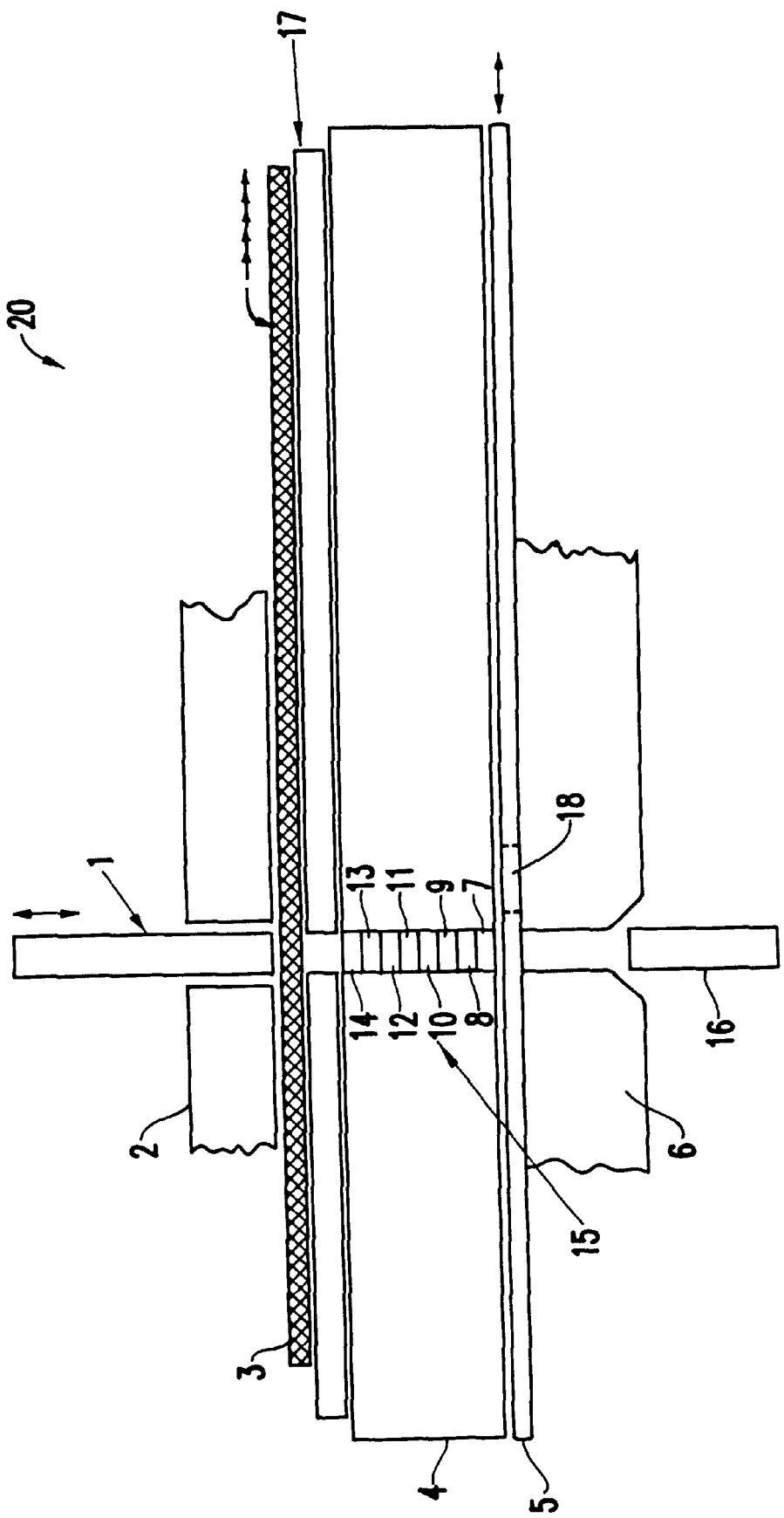
FIG. 3 is a schematic diagram of a greensheet and punch tool assembly.

The invention comprises a dry process to fill the vias in ceramic greensheets. More specifically, with the invention, a powder metal polymer organic greensheet is placed above a dielectric or ceramic greensheet and punched into vias in the dielectric green sheet. This process is referred to herein as transfer punching.

In order to fabricate a powder metal polymer organic greensheet used with the invention, metal containing powders are mixed with an organic binder and solvent or liquid to create a slurry. The slurry is then cast into thin sheets, or extruded or roll laminated to create a thin sheet. Any excess solvents are removed to create a sheet of metal powders (inorganic materials may also be present to benefit subsequent operations) and organic binders. The thin metal sheet can be mechanically punched.

The powdered metallic greensheet can contain metal powders such as, Mo, W, Cu, Ni, Pt, Pd, Ag, Au or alloys or combinations of metals and alloys. Non-metallic additives can also be used in combination with the metal powders. Such additives include various glasses, glass-ceramics, or ceramics. For example, with Molybdenum powders, additives used could include calcium-magnesium-alumino silicate glasses and/or aluminum oxide.

The organic constituents used in the powdered metallic greensheet can be organic binders, plasticizers or solvents. Two such binders are polymethyl methacrylate or polyvinyl butyral. Methanol can be used to make greensheets. The preferred thickness for the metal-containing sheet is 25 um to 50 um.

An important feature of the invention is that the powder metal polymer organic sheet has a shrinkage rate during sintering (e.g., heating to 1500° C. to 1600° C.) which is similar to the shrinkage rate of the underlying ceramic greensheet. During the sintering process, the organic material within the ceramic greensheets are released, leaving principally ceramic material. The release of the organic material and the subsequent powder densification during the sintering process causes the greensheet to shrink (as much as 15–20%). If the conductive slug which is punched into the greensheet does not have corresponding shrinkage characteristics, the greensheet will deform around the slug. The invention overcomes this problem by matching the shrinkage characteristics of the powder metal polymer organic sheet to the ceramic green sheet.

The inventive dry transfer punching method also allows the fabrication of vias with differing compositions from bottom to top. This permits the use of materials with optimized properties, such as higher glass content for improved bonding to the ceramic for most of the via and less glass content at the top surface of the via for better plating and soldering characteristics. Additionally, dielectric or resistive materials could be layered in a via to provide circuit components (e.g. capacitors, resistors, etc.).

Referring now to the drawings, and more particularly to FIG. 1, a greensheet 4 is placed in a punch tool assembly 20. Also, a blocker plate 5 is shifted so that the hole 18 lines up with hole in a die 6. The punch 1 is then moved downward through the stripper 2 and into and through the greensheet 4, punching a hole (via) 15 into the greensheet 4. A slug 16 is ejected out through the die 6 and discarded. The punch 1 is then retracted to the upper start position.

To fill the empty via 15, the powdered metallic greensheet 3 is inserted over the ceramic greensheet 4. The blocker plate 5 is then positioned to cover the hole in die 6. The punch 1 is then moved downward, punching through the metallic greensheet 3, moving a punched disc 7 of the metallic greensheet 3 down into the hole 15 to the bottom. The punch 1 is retracted and the metallic greensheet 3 is moved to a second position and the punch 1 is moved downward, again punching another disk 8 to bottom of the hole 15. The above steps are repeated until the via is filled with disks 7–14 of powdered metallic sheet 3. FIG. 1 shows eight metal sheet slugs 7–14 in the via hole 15.

The metallic greensheets 3 mentioned previously are moved after each via filling stroke to expose new unpunched material to be punched. FIGS. 2A, 2B, and 2C show three possible movements of the greensheet 3 to most efficiently utilize the metallic greensheet 3. Many other similar movement patterns would be apparent to one ordinarily skilled in this art field after reviewing this disclosure. Simple mechanical or computer driven actuators can be used to provide these movements.

In a preferred embodiment, the thickness of the metallic greensheet 3 is less than ½ the thickness of the dielectric greensheet 4, to prevent poor filling of the via 15 due to crumbling of the greensheet 4 during the transfer punching stroke. Preferably, even thinner metallic greensheets 3 are used to improve the transfer results.

Improved performance while using thicker metallic greensheets 3 can be accomplished by putting a thin die 17 (as shown in FIG. 3) below the metallic greensheet 3 and above the dielectric greensheet 4. This thin die 17 serves to provide a cleaner punched disk and prevents erosion of the top circumference of the via hole 15 by the metallic greensheet 3 during punching.

As mentioned above, the metallic greensheet 3 could include powders having high or low DC resistance materials (e.g., metals, ceramics, glasses, etc.). Also, frit or glass can be added to improve the final adhesion, after sintering, of the metal to the ceramic dielectric. Thus, as shown in FIG. 4, different formulations of sheets 3 can be inserted during the multiple punch strokes to form layers 25–28 within the via 15 with different properties varying from bottom to top (e.g., resistors, capacitors, etc.). Thus, the invention forms special vias with improved structural properties or vias with high or low electrical resistance. For example, as shown in FIG. 5, a dielectric material 32 could be punched between stacks of conductive disks 30, 31, 33 and 34 to form a capacitor. Alternatively, the vias could be engineered to promote adhesion, altered thermal expansion, enhanced platability, etc.

FIG. 6 illustrates an example of a Stepped Gradient Via and FIG. 7 illustrates an Inverted Gradient Via. In each case, the via in the top ceramic greensheet offers a gradual transition from an inner via to the surface of the substrate.

More specifically, as shown in FIG. 6, the via 64 in a top ceramic greensheet 62 is 70% metal and 30% ceramic. The second via 65 is 80% metal and 20% ceramic. The third via 66 is 90% metal and 10% ceramic. The bottom via 67 in a lower ceramic greensheet 63 is nearly 100% metal. Therefore, the invention gradually transitions from a complete conductor to a top layer which is part conductor/part insulator. The inverse is shown in FIG. 7 where the via 74 in the top ceramic greensheet 72 is 90% metal and 10% ceramic. The second via 75 is 80% metal and 20% ceramic. The third via 76 is 70% metal and 30% ceramic. The bottom via 77 in the lower ceramic greensheet 73 is 60% metal and 40% ceramic.

The invention is highly useful in electronic packaging. As mentioned above, an important feature of the invention is that the powder metal polymer organic sheet has a shrinkage rate which is similar to the shrinkage rate of the underlying ceramic greensheet. Additionally, specialized vias (e.g., graduated conductors/insulators, capacitors, resistors, etc.) can be formed with the invention.

Another key benefit is that the invention metallizes the via holes using a dry method rather than the conventional method which requires the use of solvent-containing pastes. With the inventive dry method, no solvent from the via metallic paste interacts with the ceramic greensheet, which prevents distortion of the greensheet. Additionally, after the application of the via metal, with the invention there is no need to subject the metallized greensheet to a drying process which can further alter the greensheet.

While the invention has been described in terms of preferred embodiments, those skilled in the art will recognize that the invention can be practiced with modification within the spirit and scope of the appended claims.

What is claimed is:

1. A process for filling an opening in a substrate comprising:
    positioning a sheet above said substrate;
    punching said sheet into said opening in said substrate,
    wherein said sheet and said substrate have similar shrinkage characteristics during sintering,
    wherein said punching includes sequentially punching sheets of materials having different compositions into said opening, thereby creating distinct layers in said opening, and wherein said substrate comprises a ceramic greensheet and said sheet comprises a powder metal polymer organic sheet; and
    sintering said substrate after punching.

2. The process in claim 1, wherein at least one of said distinct layers comprises an insulator and at least one of said distinct layers comprises a conductor.

3. The process in claim 1, further comprising forming a capacitor with said distinct layers.

4. A process for filling an opening in a substrate comprising:
    positioning a sheet above said substrate;
    punching said sheet into said opening in said substrate,
    wherein said sheet and said substrate have similar shrinkage characteristics during sintering,
    wherein said sheet has a thickness less than that of said substrate and said process includes repeating said punching of said sheet into said substrate until said opening is full; and
    sintering said substrate after punching.

5. A process for filling an opening in a substrate comprising:
    positioning a sheet above said substrate;
    punching said sheet into said opening in said substrate;
    wherein said sheet and said substrate have similar shrinkage characteristics during sintering,
    wherein said punching includes sequentially punching sheets of materials having different compositions into said opening, thereby creating distinct layers in said opening, and
    wherein said distinct layers comprise graduated material features; and
    sintering said substrate after punching.

6. A process for filling an opening in a substrate comprising:
    forming a sheet by:
        mixing metal containing powders with an organic binder and solvent to form a slurry; and
        casting said slurry into sheets;
    positioning said sheet above said substrate;
    punching said sheet into said opening in said substrate,
    wherein said sheet and said substrate have similar shrinkage characteristics during sintering,
    wherein said punching includes sequentially punching sheets of materials having different compositions into said opening, thereby creating distinct layers in said opening; and
    sintering said substrate after punching.

7. A process for forming a multi-layer structure in a substrate comprising:
    punching a first material into an opening in said substrate;
    punching a second material different than said first material into said opening above said first material, such that said first material and said second material remain in said opening; and
    selectively repeating one or more of said punching processes to fill said opening with multiple layers of one or more of said first material and said second material, wherein said first material comprises a conductor and said second material comprises an insulator.

8. A process for forming a multi-layer structure in a substrate comprising:
    punching a first material into an opening in said substrate;
    punching a second material different than said first material into said opening above said first material, such that said first material and said second material remain in said opening; and
    punching additional material layers having different compositions into said opening, wherein said first material comprises a conductor and said second material comprises an insulator.

9. A process for forming a multi-layer structure in a substrate comprising:
    punching a first material into an opening in said substrate; and
    punching a second material different than said first material into said opening above said first material, such that said first material and said second material remain in said opening,
    wherein said substrate comprises a ceramic greensheet and said first material comprises a powder metal polymer organic sheet.

10. The process in claim 9, further comprising forming said powder metal polymer organic sheet by:

mixing metal containing powders with an organic binder and solvent to form a slurry; and casting said slurry into sheets.

11. A process for forming a multi-layer structure in a substrate comprising:

punching a first material into an opening in said substrate;

punching a second material different than said first material into said opening above said first material, such that said first material and said second material remain in said opening;

selectively repeating one or more of said punching processes to fill said opening with multiple layers of one or more of said first material and said second material, wherein said substrate, said first material and said second material have similar shrinkage characteristics during sintering; and sintering said substrate after selectively repeating one or more of said punching processes.

12. A process for forming a multilayer ceramic substrate comprising:

positioning a sheet above said substrate;

punching said sheet into an opening in said substrate;

filling said opening with punched items from said sheet, wherein said sheet and said substrate have similar shrinkage characteristics during sintering; and sintering said substrate after filling.

13. The process in claim 12, wherein said substrate comprises a ceramic greensheet and said sheet comprises a powder metal polymer organic sheet.

14. The process in claim 12, wherein said punching includes sequentially punching sheets of materials having different compositions into said opening, thereby creating distinct layers in said opening.

15. The process in claim 14, wherein at least one of said distinct layers comprises an insulator and at least one of said distinct layers comprises a conductor.

16. The process in claim 14, further comprising forming a capacitor with said distinct layers.

17. The process in claim 14, wherein said distinct layers comprise graduated material features.

18. The process in claim 12, further comprising forming said sheet by:

mixing metal containing powders with an organic binder and solvent to form a slurry; and casting said slurry into sheets.

19. A process for forming a multilayer ceramic substrate comprising:

positioning a sheet above said multilayer ceramic substrate;

punching said sheet into an opening in said multilayer ceramic substrate, wherein said sheet and said multilayer ceramic substrate have similar shrinkage characteristics during sintering, wherein said sheet has a thickness less than that of said multilayer ceramic substrate and said process includes repeating said punching of said sheet into said multilayer ceramic substrate until said opening is full; and sintering said multilayer ceramic substrate after punching.

20. A process for forming a multi-layer structure in a substrate comprising:

punching a first material into an opening in said substrate;

punching a second material different than said first material into said opening above said first material, such that said first material and said second material remain in said opening, wherein said substrate, said first material and said second material have similar shrinkage characteristics during sintering;

punching additional material layers having different compositions into said opening; and sintering said substrate after punching additional material layers.

* * * * *